US006361205B2

(12) United States Patent
Andersen

(10) Patent No.: US 6,361,205 B2
(45) Date of Patent: Mar. 26, 2002

(54) METHOD OF DETERMINING CONTACT WEAR IN A TRIP UNIT

(75) Inventor: Bo L. Andersen, Burlington, CT (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/789,875

(22) Filed: Feb. 21, 2001

Related U.S. Application Data

(62) Division of application No. 09/221,884, filed on Dec. 28, 1998, now Pat. No. 6,231,227.

(51) Int. Cl.[7] ........................ G01N 25/72; B65B 57/02; G01R 31/327

(52) U.S. Cl. ............................ 374/45; 374/4; 374/141; 324/424; 340/638; 702/132; 702/136

(58) Field of Search ................................ 374/4–7, 141, 374/152, 45; 340/638, 639, 644, 635, 584, 514, 588, 589, 593; 324/424, 422, 699, 713; 307/650, 651; 702/130, 132, 136

(56) References Cited

U.S. PATENT DOCUMENTS

| | | | | |
|---|---|---|---|---|
| 4,901,061 A | | 2/1990 | Twerdochlib | 340/514 |
| 5,216,623 A | | 6/1993 | Barrett et al. | 374/141 |
| 5,270,658 A | | 12/1993 | Epstein | 340/638 |
| 5,629,869 A | * | 5/1997 | Johnson et al. | 702/34 |
| 5,697,705 A | | 12/1997 | Callewaert | 374/141 |
| 5,742,513 A | * | 4/1998 | Bouhenguel et al. | 702/59 |
| 5,745,114 A | * | 4/1998 | King et al. | 702/60 |
| 5,867,809 A | * | 2/1999 | Soga et al. | 702/130 |
| 5,883,568 A | | 3/1999 | Boyden | 374/141 |
| 5,941,370 A | | 8/1999 | Nichols | 200/262 |
| 6,023,036 A | | 2/2000 | Nichols | 200/262 |
| 6,231,227 B1 | * | 5/2001 | Andersen | 374/4 |

FOREIGN PATENT DOCUMENTS

| | | | |
|---|---|---|---|
| JP | 17326 | 2/1983 | 374/187 |
| WO | 11573 | 3/1998 | 200/262 |

* cited by examiner

*Primary Examiner*—Diego Gutierrez
*Assistant Examiner*—Stanley J. Pruchnic, Jr.
(74) *Attorney, Agent, or Firm*—Cantor Colburn LLP

(57) ABSTRACT

A method of determining contact wear in a trip unit of a circuit breaker is presented. The trip unit includes a microcontroller and associated memories. An algorithm (program) stored in a memory of the trip unit measures temperatures relative to circuit breaker contacts and cumulative energy dissipated in the breaker contacts, and utilizes them in a variety of analysis techniques within the trip unit to determine contact wear. These techniques include, by way of example, differential temperature analysis, measurement of cumulative energy dissipated in the breaker contacts, and calculated contact wear using sampled electrical currents and voltage and Ohm's law.

15 Claims, 1 Drawing Sheet

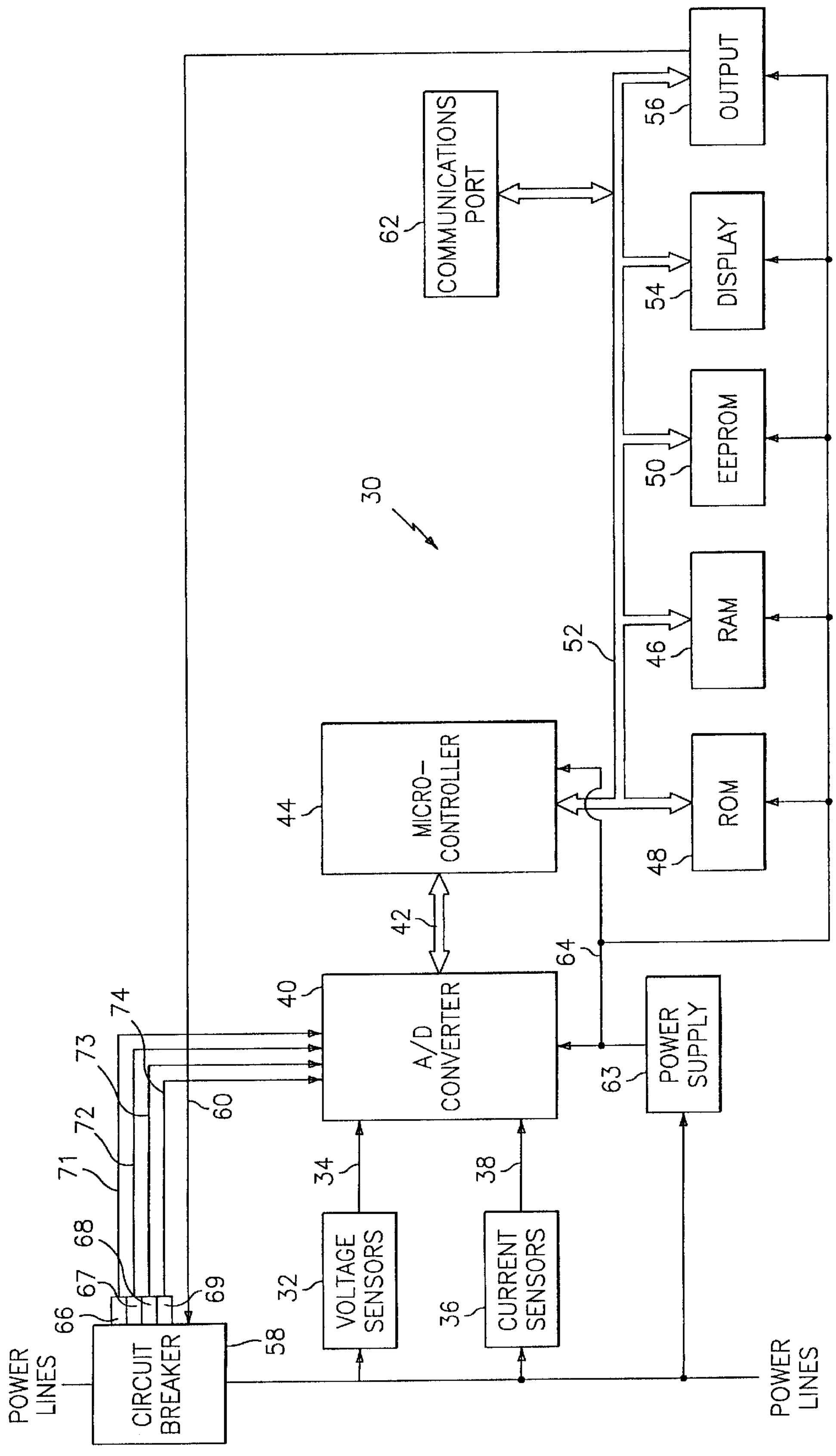
*FIGURE*

METHOD OF DETERMINING CONTACT WEAR IN A TRIP UNIT

CROSS REFERENCE TO RELATED APPLICATION

This application is a divisional of U.S. patent application Ser. No. 09/221,884 filed Dec. 28, 1998, now U.S. Pat. No. 6,231,227, which is incorporated by reference in its entirety.

BACKGROUND OF THE INVENTION

The present invention relates generally to electronic trip units. More specifically, the present invention relates to a method of determining contact wear of a circuit breaker at an electronic trip unit.

Electronic trip units (trip units) are well known. An electronic trip unit typically comprises voltage and current sensors which provide analog signals indicative of the power line signals. The analog signals are converted by an A/D (analog/digital) converter to digital signals which are processed by a microcontroller. The trip unit further includes RAM (random access memory), ROM (read only memory) and EEPROM (electronic erasable programmable read only memory) all of which interface with the microcontroller. The ROM includes trip unit application code, e.g., main functionality firmware, including initializing parameters, and boot code. The EEPROM includes operational parameters for the application code. An output of the electronic trip unit actuates a circuit breaker. The circuit breaker typically includes a pair of contacts which allows circuit current to pass from one contact member to another contact member. When the contacts open, circuit current is prevented from flowing from one contact member to the other and therefore, circuit current is prevented from flowing to a load which is connected to the breaker.

Circuit breaker contact wear, is a frequently occurring yet difficult to measure or predict problem because it is affected by a variety of factors. Contact wear is affected by the cumulative energy dissipated through arcing as breakers are opened. However, a single severe over-current fault can destroy contacts more quickly than several smaller faults, even though the smaller faults may add up to the same total energy dissipated. For example, some types of faults have more severe effects on contact wear than others, ground faults will destroy contacts more quickly than manual openings. Contacts are not generally easily inspected without costly disassembly and power down. However, if not detected contact wear may result in loss of power. The only current solution to this is defensive preventative maintenance whether required or not.

BRIEF SUMMARY OF THE INVENTION

The above discussed and other drawbacks and deficiencies are overcome or alleviated by a method of detecting contact wear, at an electronic trip unit, of at least two pairs of separable contacts of a circuit breaker, the method comprising sensing temperature relative to a first pair of said at least two pairs of separable contacts to provide a first sensed contact temperature signal indicative thereof, sensing temperature relative to a second pair of said at least two pairs of separable contacts to provide a second sensed contact temperature signal indicative thereof, comparing said first and second sensed contact temperature signals to provide a differential contact temperature signal, and analyzing said differential contact temperature signal to assess contact wear of said pairs of separable contacts.

The above discussed and other drawbacks and deficiencies are also overcome or alleviated by a breaker assembly comprising an electronic trip unit and a circuit breaker having at least two pairs of separable contacts, said breaker assembly further comprising a sensor positioned for sensing temperature relative to a first pair of said at least two pairs of separable contacts to provide a first sensed contact temperature signal indicative thereof, a sensor positioned for sensing temperature relative to a second pair of said at least two pairs of separable contacts to provide a second sensed contact temperature signal indicative thereof, and a signal processor responsive to said first sensed contact temperature signal and said second sensed contact temperature signal, and having memory for storing signals including program signals defining an executable program which compares said first and second sensed contact temperature signals to provide a differential contact temperature signal, and analyzes said differential contact temperature signal to assess contact wear of said at least two pairs of separable contacts.

The above discussed and other features and additional advantages of the present invention will be appreciated and understood by those skilled in the art from the detailed description and drawing.

BRIEF DESCRIPTION OF THE DRAWINGS

Referring now to the drawing wherein the FIGURE is a schematic block diagram of an electronic trip unit of the present invention.

DETAILED DESCRIPTION OF THE INVENTION

It is therefore seen to be desirable to detect contact wear in an electronic trip unit. In a preferred embodiment of the present invention, a contact wear detection algorithm (program) is initialized in the microcontroller of the trip unit for detecting contact wear. The contact wear detection algorithm (1) measures temperatures of arcs in close proximity to circuit breaker contacts, and/or (2) calculates and stores cumulative energy dissipated in the breaker contacts as a result of open and close operations. A variety of analysis techniques are utilized within the trip unit to determine contact wear. An accurate assessment of contact wear is yielded by these methods, separately or in combination.

The electronic trip unit of the present invention comprising voltage, current, and temperature sensors which provide analog signals indicative of the power line signals, contact temperatures, and ambient temperatures. The analog signals are converted by an A/D (analog/digital) converter to digital signals which are processed by a microcontroller. The trip unit further includes RAM (random access memory), ROM (read only memory) and EEPROM (electronic erasable programmable read only memory) all of which communicate with the microcontroller. The ROM includes trip unit application code, e.g., main functionality firmware, including initializing parameters, and boot code. The application code includes code for the contact wear detection algorithm of the present invention. The EEPROM includes operational parameters, e.g., code for setting user defined thresholds for the contact wear detection algorithm for the application code. These parameters may be stored in the trip unit at the factory and are selected to meet customers' requirements, but can also be remotely downloaded.

Temperature and electrical analysis is used to develop thermodynamic and electrical models of frame geometries of circuit breakers. These models provide the contact wear algorithm with the nominal operating parameters required to predict contact resistance and heat rise over ambient temperatures as a function of current flow through the breakers as the contacts wear. Alarms can be generated when (1) contact heat rise over ambient temperature deviates from stored nominal values, or (2) when calculated contact resistance (R=V/I phase corrected) deviates from stored specified maximum values. Thereby indicating that maintenance or replacement of the breaker is required due to contact wear.

The frame geometry of a circuit breaker may affect the rate at which heat is thermodynamically conducted away from the circuit breaker contacts and are modeled or experimentally determined for each model of breaker at rated current ranges. As contact wear resistance increases the temperature across the contacts during closed operation of the circuit breaker will increase with the contacts acting as electrical resistors dissipating electric energy as heat. This in turn has an accelerating effect on the rate of wear of the contacts. If undetected this will eventually lead to the mechanical and/or electrical failure of the breakers leading to a power outage.

Referring to the FIGURE, a general schematic of an electronic trip unit of the present invention is generally shown at 30. Trip unit 30 comprises a voltage sensor or sensors 32 which provides analog signals indicative of voltage measurements on a signal line 34 and a current sensor or sensors 36 which provides analog signals indicative of current measurements on a signal line 38. The analog signals on lines 34 and 38 are presented to an A/D (analog/digital) converter 40, which converts these analog signals to digital signals. The digital signals are transferred over a bus 42 to a microcontroller (signal processor) 44, such being commercially available from the Hitachi Electronics Components Group (Hitachi's H8/300 family of microcontrollers). Trip unit 30 further includes RAM (random access memory) 46, ROM (read only memory) 48 and EEPROM (electronic erasable programmable read only memory) 50 all of which communicate with the microcontroller 44 over a control bus 52. It will be appreciated that A/D converter 40, ROM 48, RAM 46, or any combination thereof may be internal to microcontroller 44, as is well known. EEPROM 50 is non-volatile so that system information and programming will not be lost during a power interruption or outage. Data, typically status of the circuit breaker, is displayed by a display 54 in response to display signals received from microcontroller 44 over control bus 52. An output control device 56, in response to control signals received from microcontroller 44 over control bus 52, controls a circuit breaker 58 via a line 60.

A plurality of temperature sensors 66–69 are located within circuit breaker 58. Temperature sensors 66–68 are each located in close proximity to contacts for phase A, B and C, respectively. The exact location of the sensor is not critical as it will be different for various circuit breakers. What is important is that these temperature sensors 66–68 be located relative to their respective contacts to provide an indication of temperature at that contact. Temperature sensor 69 is also located in circuit breaker 58, however it is located away from the contacts of the circuit breaker to sense ambient temperature within the circuit breaker itself. The temperature sensors 66–69 may be simple thermocouple devices which provide an analog signal indicative of the sensed temperature. These temperature sensed analog signals on lines 71–74 are presented to A/D converter 40, where they are converted to digital signals. These digital signals are then transferred over bus 42 to microcontroller 44 and processed in accordance with the present invention.

Calibration, testing, programming and other features are accomplished through a communications I/O port 62, which communicates with microcontroller 44 over control bus 52. A power supply 63 which is powered by the service electricity, provides appropriate power over a line 64 to the components of trip unit 30. ROM 48 includes trip unit application code, e.g., main functionality firmware, including initializing parameters, and boot code. The application code includes code for a contact wear detection algorithm in accordance with the present invention.

EEPROM 50 includes operational parameter code, e.g., code for setting user defined thresholds for the contact wear detection algorithm. These parameters may be stored in the trip unit at the factory and are selected to meet customers' requirements, but can also be remotely downloaded as described hereinafter. The contact wear detection algorithm is run in real-time and is initiated preferably from the boot code at start up.

The contact wear detection algorithm (program) of the present invention calculates differential temperatures between each contact sensor 66–68 and the ambient sensor 69, and differential temperatures between the contacts sensors 66–68, i.e., the difference between sensor 66 (phase A) and sensor 67 (phase B), the difference between sensor 67 (phase B) and sensor 68 (phase C), and the difference between sensor 68 (phase C) and sensor 66 (phase A). The contact wear detection algorithm estimates resistance of contacts based on contact heat rise over ambient temperature and compares the results to a stored table of expected heat rises as a function of current. For example, if current in phase A is 400 amps, ambient temperature 90 degrees, and contact temperature of phase A is 140 degrees, then heat rise over ambient is 140−90=50 degrees. If the stored table in this example shows the expected heat rise at 400 amps current to be only 30 degrees, and if an alarm threshold is set to allow only a 10 degree deviation (or 40 degrees) then an alarm will be issued.

Also, OHM's law resistance-in-contact=voltage-across-contact divided by current-through-contact (AC phase adjusted) is used to calculate the contact resistance which is compared against a stored maximum allowable value. Thereby allowing for alternate means of assessing this parameter for each breaker contact.

In accordance with another embodiment of the present invention a statistical standard deviation analysis of these differential temperatures relative to predefine differential temperature means (arithmetic) is used to identify imminent severe failures, (such as defined in U.S. patent application Ser. No. 09/221,243 now pending entitled Method of Statistical Analysis In An Intelligent Electronic Device, filed concurrently herewith, which is herein incorporated by reference.) Alternatively, these differential temperatures are compared to pre-set maximum acceptable values and an alarm is used when a maximum valve is exceeded. In still another alternative, the circuit breaker geometry is thermodynamically modeled, i.e., current through the circuit breaker contacts, contact temperatures, ambient temperatures, and a maximum acceptable contact resistance constant are used to calculate a predicted contact resistance. An alarm is issued when the predicted contact resistance exceeds the maximum. Thermodynamic and electrical modeling of the circuit breaker will be readily apparent to one of ordinary skill in the art, using basic thermodynamic and electrical equations and known modeling tools. The method of such modeling is not critical to the present invention, rather this is simply another method for comparing the sensed temperatures to benchmarks or limits for assessing contact wear.

In accordance with still another embodiment of the present invention, for each trip event and manual opening (such can be detected as set forth in U.S. patent application Ser. No. 09/221,244 now U.S. Pat. No. 6,282,499), entitled Method of Detecting Manual Trips In An Intelligent Electronic Device, filed concurrently herewith, which is incorporated herein by reference) of an energized breaker a measure of the energy dissipated as breakers are opened is calculated as ($I^2$) (T), where I is the contact current and T is the contact temperature. This energy dissipation is calculated and then summed up in registers of the microcontroller for each contact and for each fault type, e.g., short-time, long-time, ground fault, instantaneous, and manual, to provide cumulative fault energy by fault type or total.

The cumulated fault energy by fault type or total is compared to the thresholds (which may be set by the user) with alarms being issued when the threshold is exceeded. Also, empirical constants may be assigned to the cumulate fault energy for different fault types to make, e.g., ground faults more severe than manual openings.

In addition to detecting contact wear, the present invention can be used to develop a history of contact wear progression over time. As contact temperatures across the contacts increases, contact wear will also increase. This information can be used to predict how much of a contact's life is used up (or remains).

A priority ranking of maintenance tasks for maintaining circuit breakers may be established based on this information, i.e., which circuit breaker will require maintenance first due to contact wear. Many large facilities have hundreds of circuit breakers to maintain. Users typically overhaul a certain percentage of their circuit breakers annually. Therefore accurately prioritizing the order in which individual circuit breaker problems should be addressed will allow for more effective use of limited resources, and help decrease facility down time.

All of the aforementioned limits or settings are preferably stored in EEPROM 50 and can be altered by downloading desired settings via communications I/O port 62. This would include remotely downloading such data when the unit is connected to a system computer (not shown), either directly, over the telephone lines, or any other suitable connection. It may also be preferred that EEPROM 50 comprises a flash memory whereby such data is flashed, as is well known.

In terms of communicating contact wear information, this can occur in several ways: (1) generating an event message to be transmitted via a network connection to an attached computer (not shown) or other central monitoring device (not shown); (2) displaying a message on display 54 of the trip unit or breaker; or (3) closing a relay contact which in turn may be used to operate a horn, warning light or other alarm (not shown). Contact wear information may also be displayed (or printed) in the form of a log. Information of, e.g., accelerated contact wear, is useful as an aid in determining the cause or root (i.e., systemic root cause) of a problem that may otherwise be difficult to determine.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of detecting contact wear, at an electronic trip unit, of at least two pairs of separable contacts of a circuit breaker, the method comprising:

sensing temperature relative to a first pair of said at least two pairs of separable contacts to provide a first sensed contact temperature signal indicative thereof;

sensing temperature relative to a second pair of said at least two pairs of separable contacts to provide a second sensed contact temperature signal indicative thereof;

comparing said first and second sensed contact temperature signals to provide a differential contact temperature signal; and analyzing said differential contact temperature signal to assess contact wear of said pairs of separable contacts.

2. The method of claim 1 further comprising:

sensing ambient temperature of said circuit breaker to provide a sensed ambient temperature signal indicative thereof;

comparing at least one of said first and second sensed contact temperature signals with said sensed ambient temperature signal to provide at least one differential ambient temperature signal; and wherein said analyzing further comprises analyzing said differential contact temperature signal and said at least one said differential ambient temperature signal to assess contact wear of said pairs of separable contacts.

3. The method of claim 1 wherein said analyzing comprises statistical standard deviation analyzing of said differential contact temperature signal relative to a mean differential temperature.

4. The method of claim 1 wherein said analyzing comprises comparing said differential contact temperature signal to a limit.

5. The method of claim 1 wherein said analyzing comprises predicting a contact resistance of at least one of said pairs of separable contacts in response to said differential contact temperature signal and comparing said predicted contact resistance to a limit.

6. The method of claim 5 wherein said predicting comprises modeling resistance of said at least one of said pairs of separable contacts and applying said differential contact temperature signal to said modeling to provide said predicted contact resistance.

7. The method of claim 1 further comprising:

displaying information indicative of contact wear of said separable contacts in response to said analyzing.

8. A breaker assembly comprising an electronic trip unit and a circuit breaker having at least two pairs of separable contacts, said breaker assembly further comprising:

a sensor positioned for sensing temperature relative to a first pair of said at least two pairs of separable contacts to provide a first sensed contact temperature signal indicative thereof;

a sensor positioned for sensing temperature relative to a second pair of said at least two pairs of separable contacts to provide a second sensed contact temperature signal indicative thereof; and a signal processor responsive to said first sensed contact temperature signal and said second sensed contact temperature signal, and having memory for storing signals including program signals defining an executable program which compares said first and second sensed contact temperature signals to provide a differential contact temperature signal, and analyzes said differential contact temperature signal to assess contact wear of said at least two pairs of separable contacts.

9. The breaker assembly of claim 8 further comprising:

a sensor positioned for sensing ambient temperature of said circuit breaker to provide a sensed ambient temperature signal indicative thereof;

wherein said processor further compares at least one of said first and second sensed contact temperature signals with said sensed ambient temperature signal to provide at least one differential ambient temperature signal, and said processor further analyzes said differential contact temperature and said at least one differential ambient temperature signal to assess contact wear of said at least two pairs of separable contacts.

10. The breaker assembly of claim 8 wherein said processor analyzes said differential contact temperature signal utilizing statistical standard deviation relative to a mean differential temperature.

11. The breaker assembly of claim 8 wherein said processor further compares said differential contact temperature signal to a limit.

12. The breaker assembly of claim 8 wherein said processor further predicts a contact resistance of at least one of said pairs of separable contacts in response to said differential contact temperature signal to result in a predicted contact resistance and compares said predicted contact resistance to a limit.

13. The breaker assembly of claim 12 wherein said processor models resistance of at least one of said two pairs of separable contacts and applies said differential contact temperature signal to provide said predicted contact resistance.

14. The breaker assembly of claim 8 further comprising:

a display for displaying information indicative of contact wear of said contacts.

15. A breaker assembly comprising an electronic trip unit and a circuit breaker having at least two pairs of separable contacts, said breaker assembly further comprising:

means for sensing temperature relative to a first pair of said at least two pairs of separable contacts to provide a first sensed contact temperature signal indicative thereof;

means for sensing temperature relative to a second pair of said at least two pairs of separable contacts to provide a second sensed contact temperature signal indicative thereof; and means for storing signals including program signals defining an executable program which compares said first and second sensed contact temperature signals to provide a differential contact temperature signal, and analyzes said differential contact temperature signal to assess contact wear of said at least two pairs of separable contacts.

* * * * *